United States Patent [19]

Wong et al.

[11] Patent Number: 5,572,127
[45] Date of Patent: Nov. 5, 1996

[54] INHOMOGENEITIES IN STATIC MAGNETIC FIELDS NEAR SUPERCONDUCTING COILS

[75] Inventors: Wai H. Wong, Monterey Park; Vincent Y. Kotsubo, Sunnyvale, both of Calif.

[73] Assignee: Conductus, Inc.

[21] Appl. No.: 473,696

[22] Filed: Jun. 7, 1995

Related U.S. Application Data

[63] Continuation-in-part of Ser. No. 297,352, Aug. 29, 1994, Pat. No. 5,508,613.
[51] Int. Cl.$^6$ .............................. G01V 3/00; G01V 3/14
[52] U.S. Cl. ...................... 324/315; 324/318; 324/319; 324/322
[58] Field of Search ................................ 324/315, 318, 324/319, 322

[56] References Cited

U.S. PATENT DOCUMENTS 5,276,398  1/1994  Withers et al. ................. 324/318

Primary Examiner—Sandra L. O'Shea
Assistant Examiner—Mack Haynes
Attorney, Agent, or Firm—Judith A. DeFranco, Esq.

[57] ABSTRACT

Inhomogeneities in the magnetic field in the vicinity of a superconducting NMR receiver coil are avoided by placing the probe, at about room temperature, within the magnetic field, cooling rapidly to just above the critical temperature of the superconductor and then controllably cooling the coil to operating temperature at a rate of 3 K./minute or less.

10 Claims, 2 Drawing Sheets

INHOMOGENEITIES IN STATIC MAGNETIC FIELDS NEAR SUPERCONDUCTING COILS

STATEMENT OF GOVERNMENT INTEREST

The U.S. Government has a paid-up license in this invention and the right in limited circumstances to require the patent owner to license others on reasonable terms as provided for by the terms of Grant No. 2R44RR09757-02 awarded by the National Institutes of Health.

CROSS-REFERENCE TO RELATED APPLICATIONS

This application is a continuation-in-part of U.S. patent application Ser. No. 08/297,352 by Vincent Y. Kotsubo and Robert D. Black filed Aug. 29, 1994, now U.S. Pat. No. 5,508,613 which is incorporated herein by reference.

BACKGROUND OF THE INVENTION

1. Field of the Invention

This application relates to methods of minimizing inhomogeneities in magnetic fields caused by superconductors placed in the magnetic fields. More particularly, it relates to a method of achieving a homogeneous field in a superconducting NMR probe coil.

2. Description of Related Art

The operating principle that underlies magnetic resonance instrumentation involves the application of a high-frequency alternating magnetic field to a sample in the presence of an orthogonal static magnetic field. This combination of fields causes nuclei in the sample to precess about the static field. The nuclear precession in turn creates an alternating magnetic field—the nuclei, in a sense, become radio transmitters. In modern nuclear magnetic resonance (NMR) spectrometers and magnetic resonance imaging (MRI) instruments, the static field is supplied by a superconducting magnet. For high field NMR spectroscopy, the static field at the sample is 5 to 18T. For high field MRI, the field maybe 1T.

The sensitivity of instrument depends upon the signal-to-noise ratio of the receiver. The sensitivity may be increased by increasing the signal (providing a higher static field) or by decreasing the noise. Noise may be due to sample noise or receiver noise. Where receiver noise is limiting, as it is in spectroscopy and in low field MRI, the signal-to-noise ratio may be greatly enhanced by lowering the noise of the receiver coil.

The use of superconductors, especially high temperature superconductors (HTS) for NMR and MRI coils has been previously reported. For example, Withers, et al., U.S. Pat. No. 5,276,398 describes a thin-film HTS probe for magnetic resonance imaging. Brey, et al., "Nuclear Magnetic Resonance Probe Coil" filed Jun. 5, 1995, describes HTS coils for NMR spectroscopy. Withers, U.S. Ser. No. 08/409,506 describes pairs of HTS coils for NMR spectroscopy. Kotsubo, U.S. Ser. No. 08/297,352 describes an apparatus for cooling NMR probe coils in a spectrometer. Each of these references in incorporated herein by reference.

While superconductors are an attractive material for NMR receiver coils due to their extremely low resistance, and correspondingly low noise levels, they have certain drawbacks. Superconductors exhibit perfect diamagnetism. When placed in a strong magnetic field, this large diamagnetic effect, combined with flux pinning can lead to unacceptable static field inhomogeneities in the environment of the receiver coil. Therefore, a method of avoiding static field inhomogeneities near superconducting receiver coils is required.

SUMMARY OF THE INVENTION

The invention overcomes the tendency of superconducting films to form inhomogeneous fields due to shielding currents and flux pinning. The invention comprises placing a superconducting coil in a static magnetic field of at least $H_{c1}$, the field at which flux first penetrates, of the superconductor and slowly cooling the coil at a rate of less than 3 K./minute from a temperature just above its critical temperature, $T_c$, to the operating temperature of the coil. In practical application, an NMR receiver coil is placed in its operating position in the static field of the spectrometer. The coil is cooled to just above the critical temperature of the superconductor from which it is made. Thereafter, the coil is slowly and controllably cooled to its operating temperature at a rate selected to avoid inhomogeneities in the coil temperature and the consequent inhomogeneity in the magnetization of the coil due to the diamagnetic properties of the superconductor and flux pinning. Preferably, the cooling is at a rate of less than 3 K./minute, more preferably at 2 K./min. The method may also be used to restore homogeneity to operating coils whose homogeneity has been disturbed. In such case, the coil is warmed from operational temperature to just above $T_c$ and then cooled as described.

DESCRIPTION OF PREFERRED EMBODIMENTS

Figure 1:
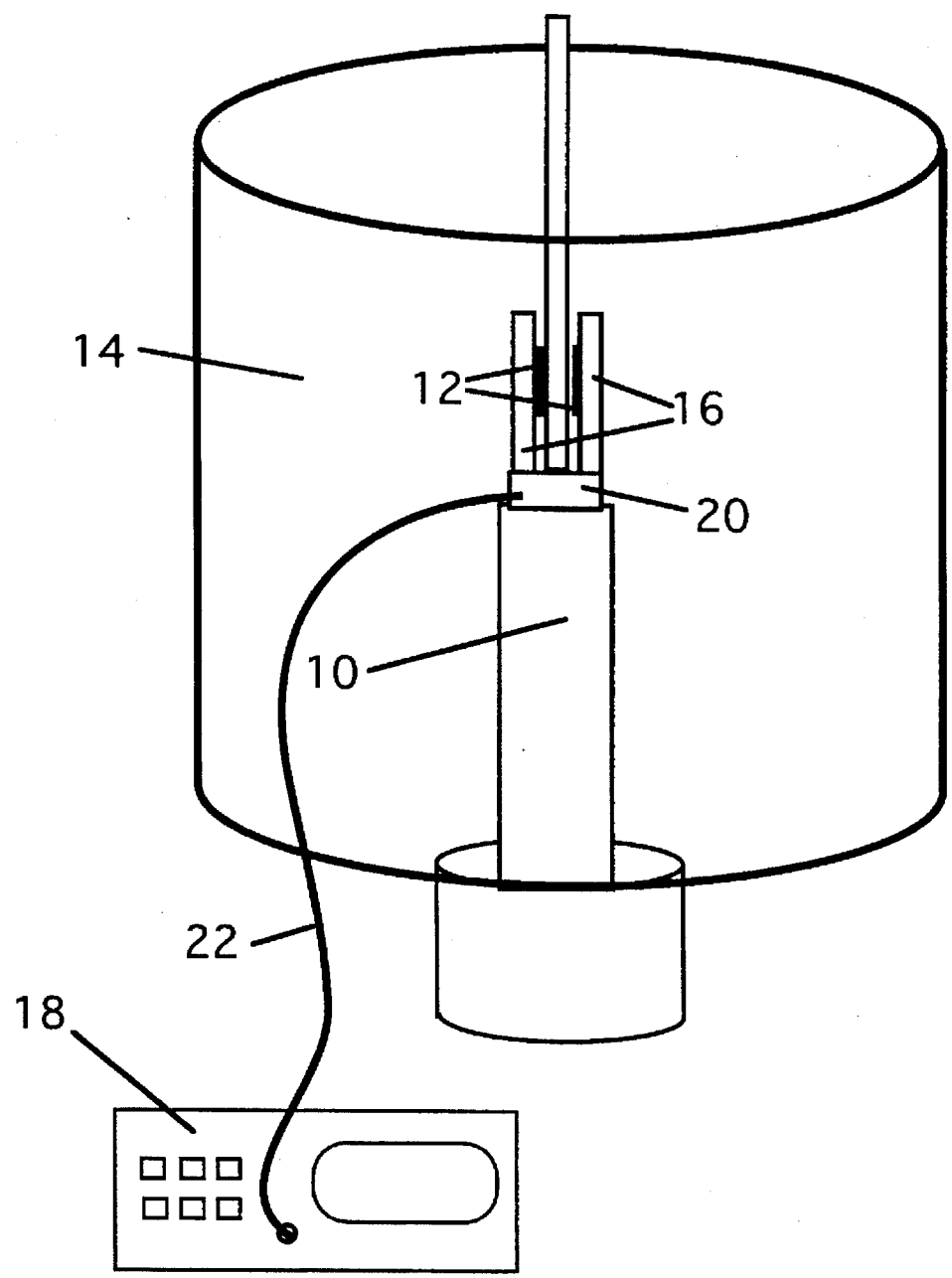
FIG. 1 depicts an NMR spectrometer with a superconducting receiver coil.

FIG. 1 depicts, in diagramatic form, the apparatus used for practicing the invention. A superconducting NMR coil probe 10 comprising two superconducting coils 12 on substrates 14 in a cooling apparatus as described by Kotsubo, supra, is placed in the static field generated by the superconducting magnets 16 of an NMR spectrometer. The superconductor may be any superconductor. Preferably, the superconductor is a high temperature superconductor. Depending upon the operating temperature, refrigeration may be by use of liquid helium, a Stirling cooler or a Gifford-McMahon cooler. A temperature controller 18 attached to the cooling apparatus monitors the temperature of the heat exchanger 20 and provides heat to the heat exchanger to modulate the rate of cooling of the coil. A Conductus ® Temperature Controller or other suitable temperature controller may be used. The temperature controller is connected to the heat exchanger by cables 22 providing temperature sensing and heating. Kotsubo et al., provides details of a suitable design for a cooling system for an NMR probe, but other systems capable of maintaining a constant operating temperature of the coil may be used.

Figure 2:
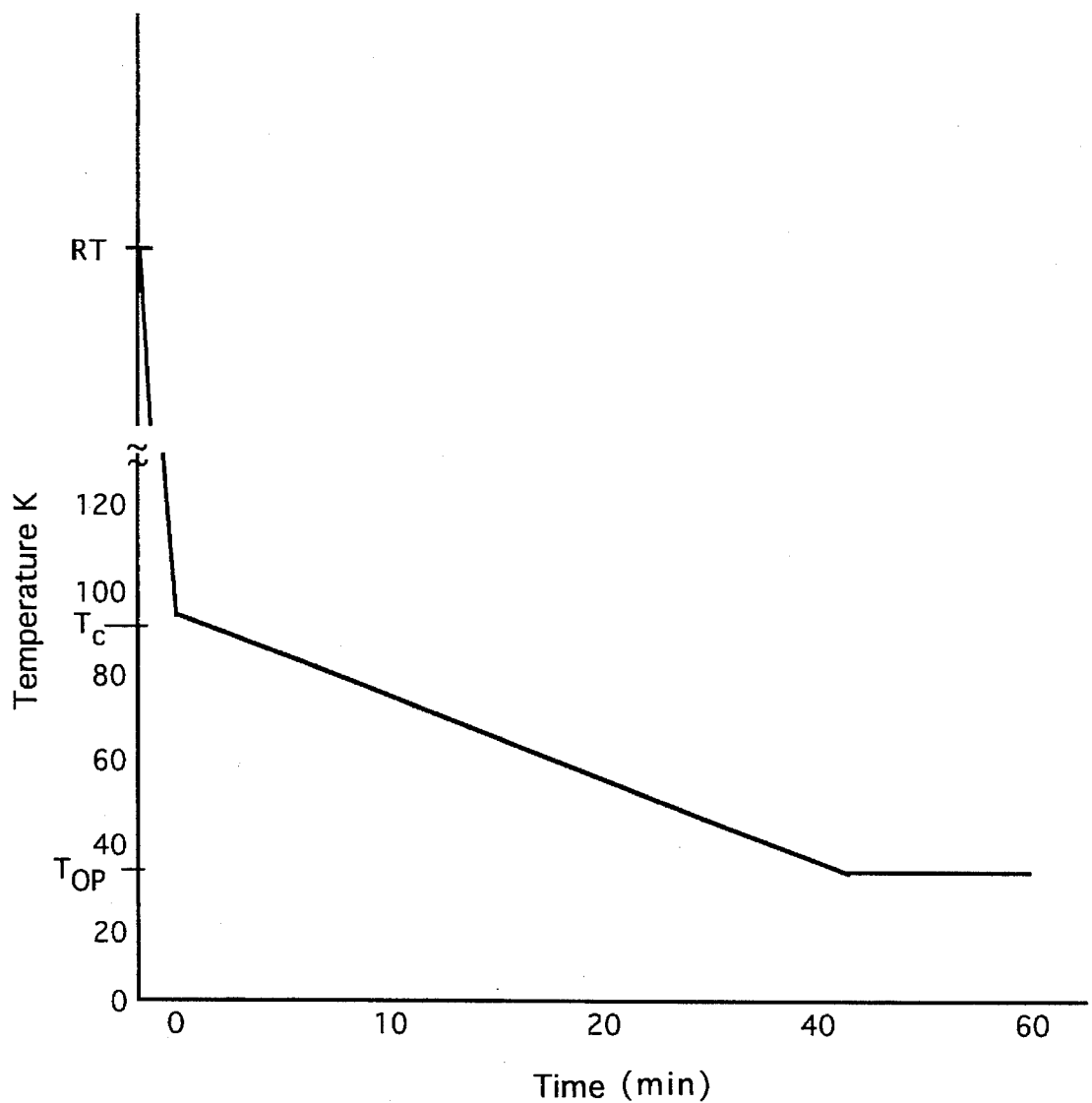
FIG. 2 is a graph of the cooling rate for the coil according to the invention.

Initially, the coil may be at or near room temperature, and in all cases is above the critical temperature $T_c$ of the superconductor. Above its critical temperature the coil is not diamagnetic. The coil is positioned within the static field of the magnet and cooled rapidly to a temperature slightly above the critical temperature of the superconductor. Beginning slightly above the critical temperature of the superconductor, the rate of cooling is reduced, preferably to less than 3 K./minute and more preferably to about 2 K./minute. Above about 3 K./minute the coil coils unequally due to a thermal gradient from the heat exchanger to the distal part of the substrate. Uneven cooling leads to flux pinning, inhomogeneities in shielding currents and, thus, to inhomogeneities of the magnetic field in the vicinity of the coil. A rate of cooling significantly below 2 K./minute leads to unacceptably long cool-down times but produces a homogeneous magnetic field. In the example shown in FIG. 2, the superconductor is YBCO, which typically has a critical temperature of about 88 K. For a YBCO coil, a suitable operating temperature is in the range of 20–35 K. In FIG. 2, the coil is to be operated at 30 K.

It will be appreciated by those skilled in the art that a number of variations are possible within the spirit and scope of the invention. For example, the invention is equally applicable to low temperature superconductors. The cooling rate need not be linear nor need it be monotonic, as long as it is adequately slow over the entire range between $T_c$ and the operating temperature of the coil. Further, it will be appreciated that the invention is useful for NMR spectroscopy and microscopy and for magnetic resonance imaging.

While the foregoing disclosure contains many specificities, it should be understood that these are given by way of example only. The scope of the invention should not be limited by the specific examples given above, but only by the appended claims and their legal equivalents.

We claim:

1. A method of preventing inhomogeneities in a static magnetic field near a superconducting coil having a critical temperature $T_c$ and a critical field $H_{c1}$ comprising:

(a) placing the coil in a static magnetic field of at least $H_{c1}$;

(b) cooling the coil in the magnetic field from a temperature above the $T_c$ of the coil at a rate of less than 3 K./minute to a desired operational temperature for the coil;

(c) maintaining the coil at the operational temperature.

2. The method of claim 1 wherein the superconducting coil is comprised of YBCO.

3. The method of claim 1 wherein the cooling is at a rate of about 2 K./minute.

4. The method of claim 1 wherein the operational temperature is between 20 K. and 35 K.

5. The method of claim 4 wherein the operational temperature is about 30 K.

6. The method of claim 1 wherein the cooling is by use of a Gifford-McMahon refrigerator.

7. The method of claim 1, further comprising the step of rapidly cooling the coil from room temperature to a temperature above the $T_c$ of the coil.

8. The method of claim 1 wherein the slowly cooling is at constant rate.

9. The method of claim 1 wherein the slowly cooling is monotonic.

10. The method of claim 1, wherein the static field is between about 1T and 18T.

* * * * *